United States Patent [19]

Jove et al.

[11] Patent Number: 5,032,935
[45] Date of Patent: Jul. 16, 1991

[54] AMPLIFICATION OF SIGNALS PRODUCED BY A MAGNETORESISTIVE ELEMENT

[75] Inventors: Stephen A. Jove, Watsonville; Klaas B. Klaassen; Long Tran, both of San Jose, all of Calif.

[73] Assignee: International Business Machines Corporation, Armonk, N.Y.

[21] Appl. No.: 449,686

[22] Filed: Dec. 12, 1989

[51] Int. Cl.$^5$ .................. G11B 5/02; G11B 5/127
[52] U.S. Cl. ........................ 360/67; 360/113
[58] Field of Search .............. 360/67, 113; 324/252; 330/60

[56] References Cited

U.S. PATENT DOCUMENTS 4,706,138 11/1987 Jove et al. ................ 360/67
4,786,993 11/1988 Jove et al. ................ 360/67

OTHER PUBLICATIONS

Jove et al., "Protective Circuit for a Magnetoresistive Element", copending application Ser. No. 07/250,784, filed 09/28/88 (now U.S. Pat. No. 4,879,610).

Primary Examiner—Vincent P. Canney
Attorney, Agent, or Firm—Otto Schmid, Jr.

[57] ABSTRACT

A circuit for producing a signal whose magnitude is a chosen amplitude compensation characteristic of the signals produced by a magnetoresistive (MR) element comprising an input stage which produces an amplified output signal which is coupled to the output stage, and control signals proportional to the resistance of the MR element and inversely proportional to the resistance of the MR element which are coupled to a feedforward circuit. The feedforward circuit generates a chosen amplitude equalization characteristic of the signals coupled to the feedforward circuit, and this signal is coupled to a bias terminal of the output stage so that the output stage produces a signal representing the chosen amplitude compensation characteristic of the signals produced by the MR element.

10 Claims, 3 Drawing Sheets

AMPLIFICATION OF SIGNALS PRODUCED BY A MAGNETORESISTIVE ELEMENT

FIELD OF THE INVENTION

This invention relates to circuits for amplifying signals produced by a magnetoresistive (MR) element and, more particularly, to such circuits which enable the selection of a chosen MR element signal amplitude compensation technique.

DESCRIPTION OF THE PRIOR ART

The prior art discloses a magnetic transducer referred to as a magnetoresistive (MR) sensor or head which has been shown to be capable of reading data from a magnetic surface at high linear densities. An MR sensor detects magnetic field signals through the resistance changes of a read element made from a magnetoresistive material. This resistance change is a function of the magnitude and direction of magnetic flux being sensed by the element.

Jove et al., U.S. Pat. No. 4,706,138, "Amplification of Signals Produced By a Magnetic Sensor", issued Nov. 10, 1987, describe an amplifier for biasing and amplifying the signals produced by an MR element, where the amplifier senses a current signal derived from the MR element which represents $dR_h/R_h$, where $R_h$ is the resistance of the MR element, and $dR_h$ is the magnetic signal-induced MR element resistance change. Also, Jove et al., U.S. Pat. No. 4,786,993, "Voltage Amplifier for Constant Voltage Biasing and Amplifying Signals From a MR Sensor", issued Nov. 22, 1988, describe an amplifier for biasing and amplifying the signals produced by an MR element, where the amplifier senses a voltage signal derived from the MR element which represents $dR_h/R_h$, where $R_h$ is the resistance of the MR element, and $dR_h$ is the magnetic signal-induced MR element resistance change.

Jove et al., "Protective Circuit for a Magnetoresistive Element", copending U.S. patent application Ser. No. 07/250,784, filed Sept. 28, 1988, describe an amplifier for biasing and amplifying the signals produced by an MR element, where the amplifier amplifies a current signal derived from the MR element which represents $dR_h$, where $R_h$ is the resistance of the MR element, and $dR_h$ is the magnetic signal-induced MR element resistance change.

However, none of the above references or any other known prior art provides a circuit which realizes a linear combination of one or more of the following gain factors: $R_h dR_h$, $dR_h$, $dR_h/R_h$, $dR_h/R_h^2$.

SUMMARY OF THE INVENTION

It is therefore the principal object of this invention to produce a circuit which enables the selection of a chosen amplitude compensation characteristic of the signals produced by a magnetoresistive (MR) element.

In accordance with the invention, a circuit for producing an electrical output signal, whose magnitude is representative of a signal produced by an MR element, comprises an MR element having a steady-state resistance value which is coupled across the input terminals of an input stage. A signal representative of the signal produced by the MR element is produced at the output terminals of the input stage, and a first control signal is generated within the input stage which is representative of the resistance of the MR element. The output terminals of the input stage are coupled to the input terminals of an output stage, and the first control signal is coupled to the input terminal of a feedforward circuit which generates a second control signal representing a chosen amplitude compensation characteristic of the signals coupled to the input of the feedforward circuit. The second control signal is coupled to a bias terminal of the output stage so that a chosen function of the signal produced by the MR element is produced at the output terminal of the output stage.

In a specific embodiment, the input stage may comprise either a preamplifier which biases the MR element with a constant voltage or a preamplifier which biases the MR element with a constant current. In a specific embodiment in which the first control signal is proportional to the resistance of the MR element, a third control signal which is inversely proportional to the resistance of the MR element can also be coupled to the input of the feedforward circuit. The feedforward circuit comprises a current mirror circuit and a switching network, and the switching network may be controlled by external signals if desired.

The foregoing and other objects, features, and advantages of the invention will be apparent from the following more particular description of a preferred embodiment of the invention as illustrated in the accompanying drawings.

DESCRIPTION OF THE PREFERRED EMBODIMENT

Figure 1:
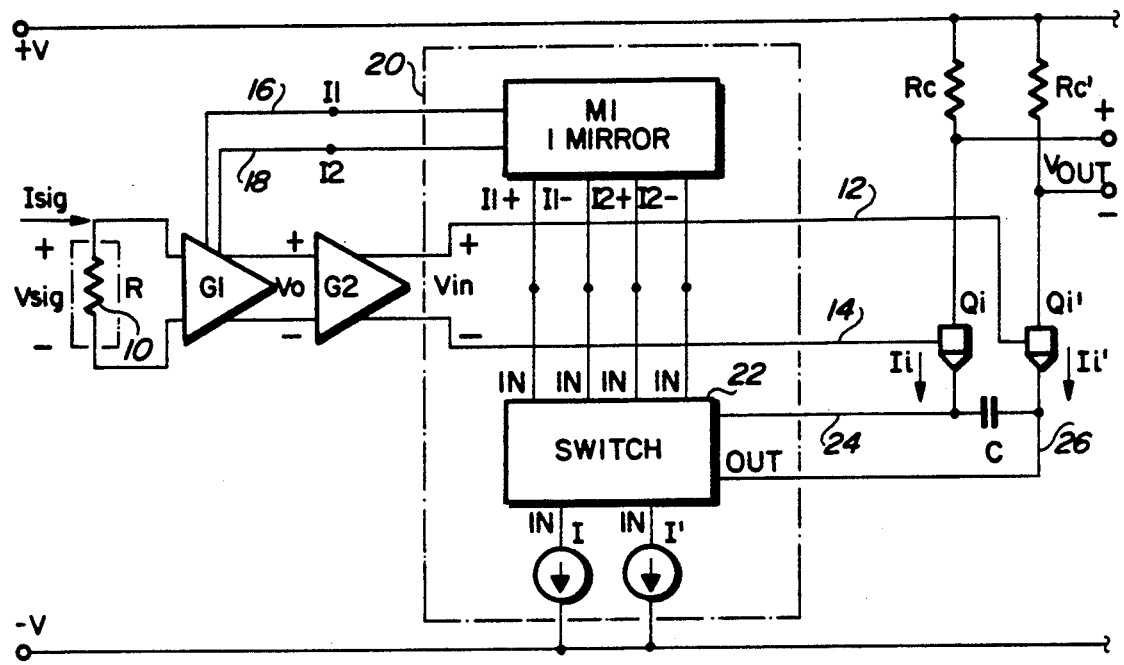
FIG. 1 is a block diagram of the basic concept of a circuit constructed according to the principles of the present invention.

The basic concept for the implementation of a magnetoresistive (MR) element amplification and detection circuit which enables the selection of a chosen function of the signals produced by the MR element will be described with reference to FIG. 1. G1 is the MR preamplifier with either constant current or constant voltage biasing of the MR element and voltage sensing. It will be recognized that a current-sensing preamplifier could also be used. G2 is a buffer stage which couples the preamplifier to the output stage comprising transistors Qi and Qi'. The signal Vsig (or Isig) is produced by MR element 10 and amplified by G1 and G2 to produce the signal Vin, which is coupled to the output stage over conductors 12 and 14. Current I1 is proportional to the resistance $R_h$ of the MR element 10, and current I2 is inversely proportional to the resistance $R_h$ of the MR element 10. These currents I1 and I2 can be generated within the preamplifier G1 and fed forward over conductors 16 and 18 to the feedforward circuit 20. Alternatively, the current I2 can be derived from I1 in a separate circuit, such as the circuit shown in FIG. 5 which will be described later.

The feedforward currents I1 and I2 are mirrored in block M1, which forms a part of feedforward circuit 20, to produce four currents which are positive and negative versions of the proportional and inversely proportional currents I1 and I2. These currents, along with fixed currents I and I', are fed into a switching network 22 which allows any combination of these currents to act as emitter bias currents on conductors 24 and 26 for output amplifying transistors Qi and Qi'. As the bias current $I_i$ varies, the gain of the overall circuit also varies proportionally to $I_i$, and this change is reflected in the output signal Vout which is taken across the collectors of transistors Qi and Qi'.

Figure 2:
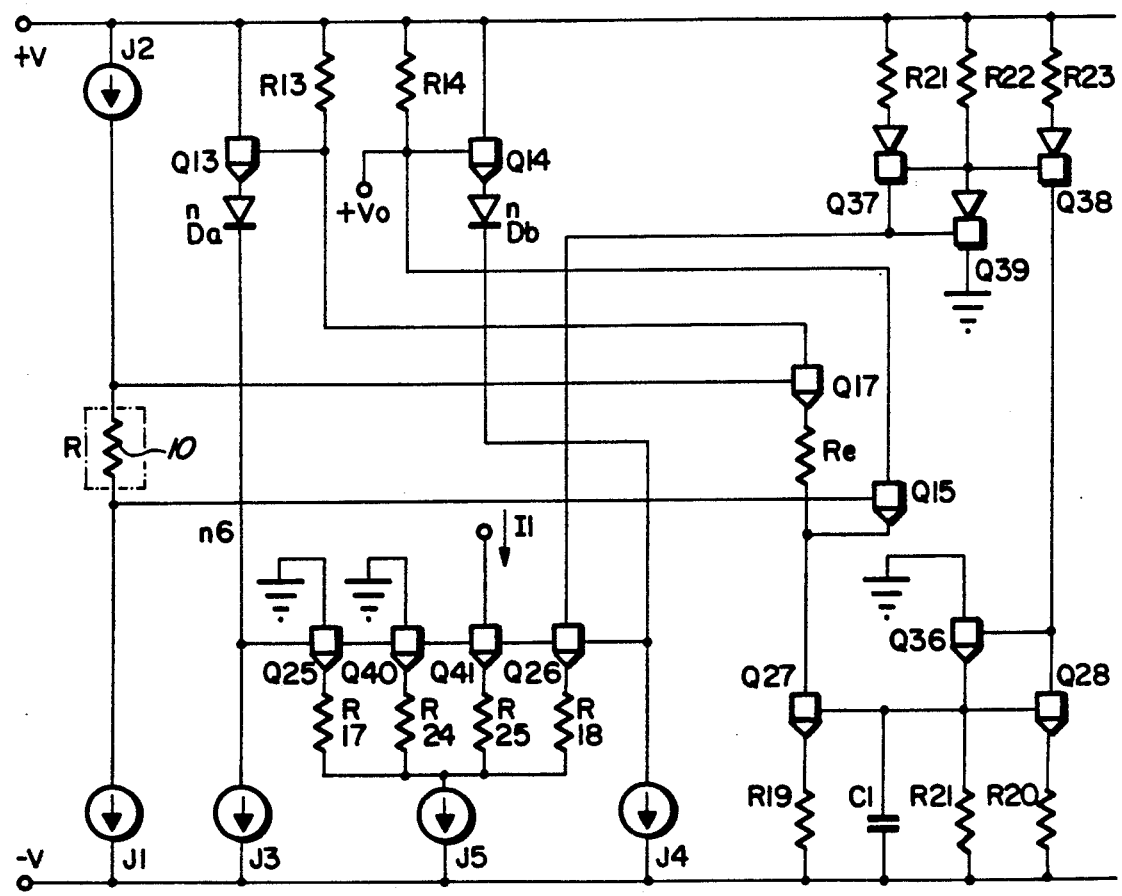
FIG. 2 is a circuit diagram of a specific embodiment of a current-biased MR preamplifier which can be used as G1 in FIG. 1.

FIG. 2 shows a specific embodiment of a current-biased MR preamplifier which can be used as G1 in FIG. 1. The MR element 10 is connected across the bases of input transistors Q17 and Q18 which amplify the signal voltage at the MR element 10. Since the gain of G2 is fixed, all combinations of amplitude correction for current-biased MR elements can be realized with this circuit if currents I1 and I2 are fed forward as shown in FIG. 1 and explained above.

Figure 3:
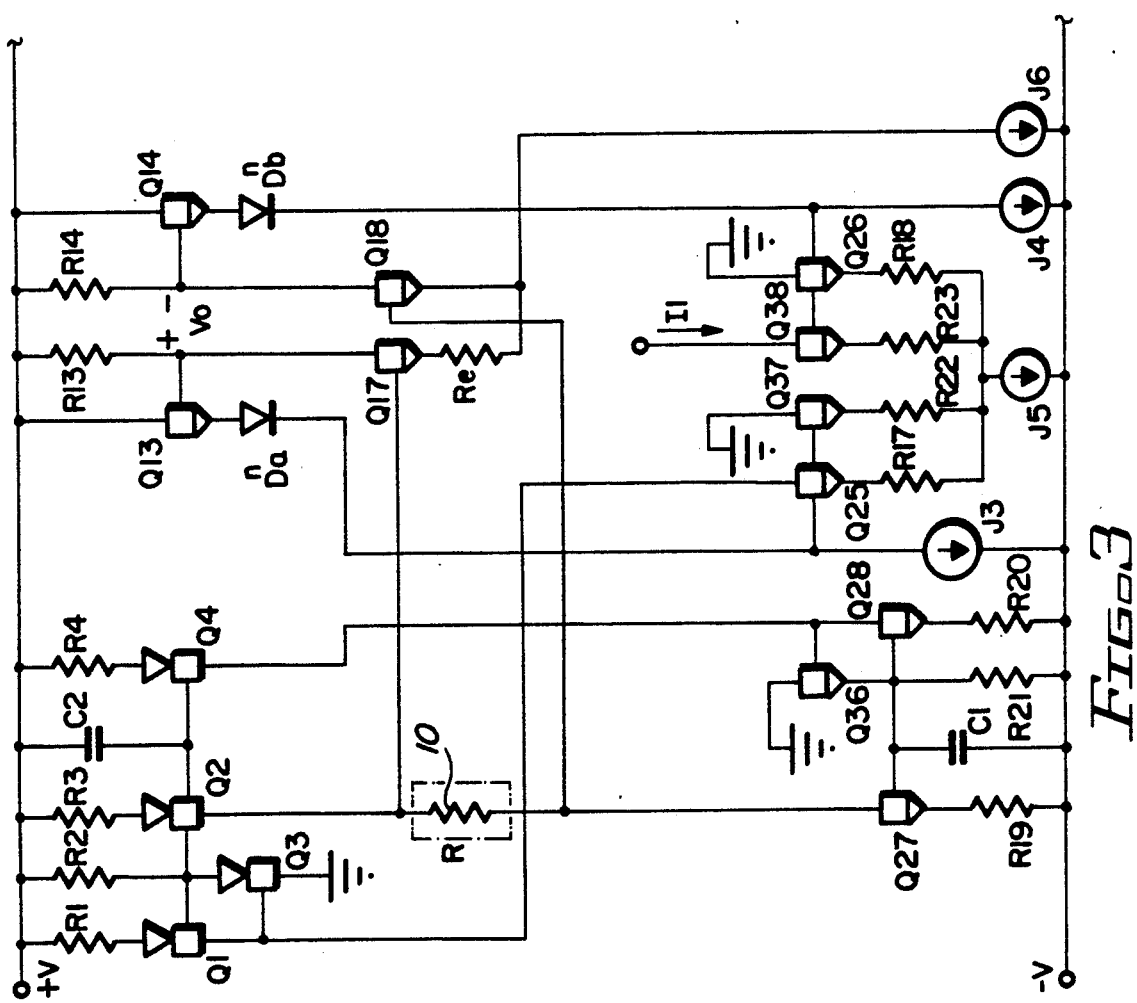
FIG. 3 is a circuit diagram of a specific embodiment of a voltage-biased MR preamplifier which can be used as G1 in FIG. 1.

The circuit of FIG. 3 shows a specific embodiment of a voltage-biased MR preamplifier which can be used as G1 in FIG. 1. Again, all combinations of amplitude correction for voltage-biased MR elements can be realized with this circuit if currents I1 and I2 are fed forward as shown in FIG. 1 and explained above.

Figure 4:
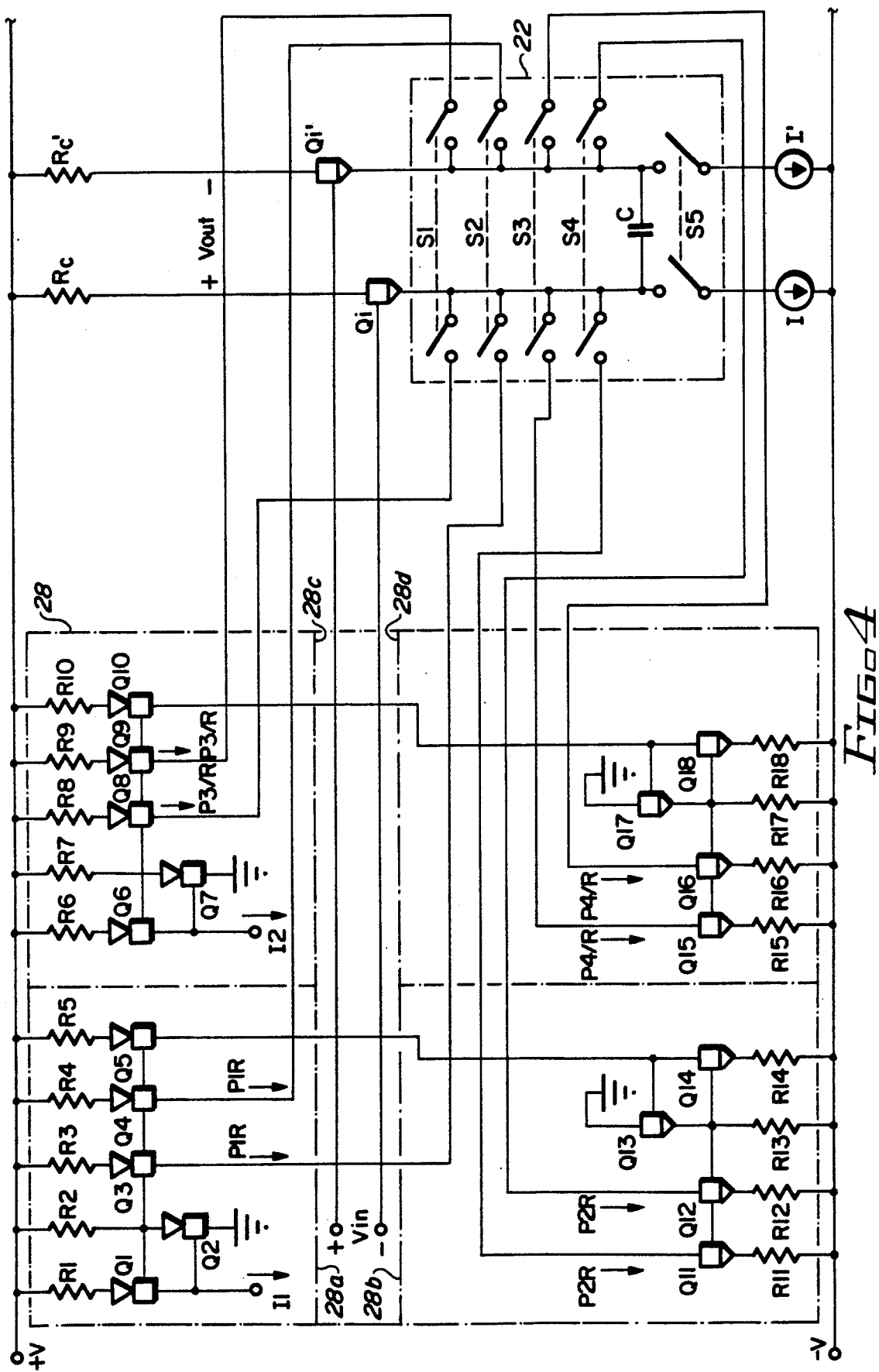
FIG. 4 is a circuit diagram of a specific embodiment of the feedforward circuit of FIG. 1.

Referring to FIG. 4, a specific embodiment of the feedforward circuit 20 of FIG. 1 is shown. The current mirror M1 of FIG. 1 is shown in the dashed box 28. In this specific embodiment, current mirror 28 comprises four separate mirror circuits 28a, 28b, 28c, and 28d having a current gain of P1, P2, P3, and P4 respectively to currents I1 and I2. The switching network 22 has also been shown in a dashed box and, in the specific embodiment, actual contact switches are shown. However, transistor switches can also be used, and these switches can be controlled locally or by a data processor. Processor control of the switches can also be expanded to vary proportionality constants associated with the input currents. This type of control lends itself to adaptive amplitude equalization as a function of the MR element resistance.

Assuming currents I1 and I2 as defined above, the table below is provided to show the types of amplitude equalization that can be generated as a function of the switch position in the specific embodiment of FIG. 4 where:
  0 = switch open,
  1 = switch closed,
  I = current-biased MR element with a voltage sensing amplifier G1, ($dR_h$ sensing), and
  V = voltage-biased MR element with a voltage sensing amplifier G1 ($dR_h/R_h$ sensing).

TABLE

| S1 | S2 | S3 | S4 | S5 | MR | Amplitude Compensation | Comments |
|---|---|---|---|---|---|---|---|
| 0 | 0 | 0 | 0 | 0 | I | Not possible | |
| 0 | 0 | 0 | 0 | 1 | I | M1 dR | (M1 = Ib I Rc/Vt) |
| 0 | 0 | 0 | 1 | 0 | I | M2 RdR | (M2 = P2 Rc Ib/Vt) |
| 0 | 0 | 0 | 1 | 1 | I | M1 dR + M2 RdR | |
| 0 | 0 | 1 | 0 | 0 | I | M3 dR/R | (M3 = P4 Rc Ib/Vt) |
| 0 | 0 | 1 | 0 | 1 | I | M1 dR + M3 dR/R | |
| 0 | 0 | 1 | 1 | 0 | I | M2 RdR + M3 dR/R | |
| 0 | 0 | 1 | 1 | 1 | I | M1 dR + M2 RdR + M3 dR/R | |
| 0 | 1 | 0 | 0 | 0 | I | Not possible | |
| 0 | 1 | 0 | 0 | 1 | I | M1 dR + M4 RdR | (M4 = −P1 Rc Ib/Vt) |
| 0 | 1 | 0 | 1 | 0 | I | M2 RdR + M4 RdR | |
| 0 | 1 | 0 | 1 | 1 | I | M1 dR + (M2 + M4) RdR | |
| 0 | 1 | 1 | 0 | 0 | I | M3 dR/R + M4 RdR | |
| 0 | 1 | 1 | 0 | 1 | I | M1 dR + M3 dR/R + M4 RdR | |
| 0 | 1 | 1 | 1 | 0 | I | (M2 + M4) RdR + M3 dR/R | |
| 0 | 1 | 1 | 1 | 1 | I | M1 dR + (M2 + M4) RdR + M3 dR/R | |
| 1 | 0 | 0 | 0 | 0 | I | Not possible | |
| 1 | 0 | 0 | 0 | 1 | I | M1 dR + M5 dR/R | (M5 = =P3 Rc Ib/Vt) |
| 1 | 0 | 0 | 1 | 0 | I | M2 RdR + M5 dR/R | |
| 1 | 0 | 0 | 1 | 1 | I | M1 dR + M2 RdR + M5 dR/R | |
| 1 | 0 | 1 | 0 | 0 | I | (M3 + M5) dR/R | |
| 1 | 0 | 1 | 0 | 1 | I | M1 dR + (M3 + M5) dR/R | |
| 1 | 0 | 1 | 1 | 0 | I | M2 RdR + (M3 + M5) dR/R | |
| 1 | 0 | 1 | 1 | 1 | I | M1 dR + M2 RdR + (M3 + M5) dR/R | |
| 1 | 1 | 0 | 0 | 0 | I | Not possible | |
| 1 | 1 | 0 | 0 | 1 | I | M1 dR + M4 RdR + M5 dR/R | |
| 1 | 1 | 0 | 1 | 0 | I | (M2 + M4) RdR + M5 dR/R | |
| 1 | 1 | 0 | 1 | 1 | I | M1 dR + (M2 + M4) RdR + M5 dR/R | |
| 1 | 1 | 1 | 0 | 0 | I | (M3 + M5) dR/R + M4 RdR | |
| 1 | 1 | 1 | 0 | 1 | I | M1 dR + (M3 + M5) dR/R + M4 RdR | |
| 1 | 1 | 1 | 1 | 0 | I | (M2 + M4) RdR + (M3 + M5) dR/R | |
| 1 | 1 | 1 | 1 | 1 | I | M1 dR + (M2 + M4) RdR + (M3 + M5) dR/R | |
| 0 | 0 | 0 | 0 | 0 | V | Not possible | |
| 0 | 0 | 0 | 0 | 1 | V | M6 dR/R | (M6 = C Rc I/Vt) |
| 0 | 0 | 0 | 1 | 0 | V | M7 dR | (M7 = C P2 Rc/Vt) |
| 0 | 0 | 0 | 1 | 1 | V | M6 dR/R + M7 dR | |
| 0 | 0 | 1 | 0 | 0 | V | M8 dR/R | (M8 = C P4 Rc/Vt) |
| 0 | 0 | 1 | 0 | 1 | V | M6 dR/R + M8 dR/$R^2$ | |
| 0 | 0 | 1 | 1 | 0 | V | M7 dR + M8 dR/$R^2$ | |
| 0 | 0 | 1 | 1 | 1 | V | M6 dR/R + M7 dR + M8 dR/$R^2$ | |
| 0 | 1 | 0 | 0 | 0 | V | Not possible | |
| 0 | 1 | 0 | 0 | 1 | V | M6 dR/R + M9 dR | (M9 = −C P1 Rc/Vt) |
| 0 | 1 | 0 | 1 | 0 | V | (M7 + M9) dR | |
| 0 | 1 | 0 | 1 | 1 | V | M6 dR/R + (M7 + M9) dR | |
| 0 | 1 | 1 | 0 | 0 | V | M8 dR/R + M9 dR | |
| 0 | 1 | 1 | 0 | 1 | V | M6 dR/R + M8 dR/$R^2$ + M9 dR | |

TABLE-continued

| S1 | S2 | S3 | S4 | S5 | MR | Amplitude Compensation | Comments |
|---|---|---|---|---|---|---|---|
| 0 | 1 | 1 | 1 | 0 | V | $(M7 + M9) dR + M8 dR/R^2$ | |
| 0 | 1 | 1 | 1 | 1 | V | $M6 dR/R + (M7 + M9) dR + M8 dR/R^2$ | |
| 1 | 0 | 0 | 0 | 0 | V | Not possible | |
| 1 | 0 | 0 | 0 | 1 | V | $M6 dR/R + M10 dR/R^2$ | $(M10 = -C P3 Rc/Vt)$ |
| 1 | 0 | 0 | 1 | 0 | V | $M7 dR + M10 dR/R^2$ | |
| 1 | 0 | 0 | 1 | 1 | V | $M6 dR/R + M7 dR + M10 dR/R^2$ | |
| 1 | 0 | 1 | 0 | 0 | V | $(M8 + M10) dR/R^2$ | |
| 1 | 0 | 1 | 0 | 1 | V | $M6 dR/R + (M8 + M10) dR/R^2$ | |
| 1 | 0 | 1 | 1 | 0 | V | $M7 dR + (M8 + M10) dR/R^2$ | |
| 1 | 0 | 1 | 1 | 1 | V | $M6 dR/R + M7 dR + (M8 + M10) dR/R^2$ | |
| 1 | 1 | 0 | 0 | 0 | V | Not possible | |
| 1 | 1 | 0 | 0 | 1 | V | $M6 dR/R + M9 dR + M10 dR/R^2$ | |
| 1 | 1 | 0 | 1 | 0 | V | $(M7 + M9) dR + M10 dR/R^2$ | |
| 1 | 1 | 0 | 1 | 1 | V | $M6 dR/R + (M7 + M9) dR + M10 dR/R^2$ | |
| 1 | 1 | 1 | 0 | 0 | V | $(M8 + M10) dR/R^2 + M9 dR$ | |
| 1 | 1 | 1 | 0 | 1 | V | $M6 dR/R + (M8 + M10) dR/R^2 + M9 dR$ | |
| 1 | 1 | 1 | 1 | 0 | V | $(M7 + M9) dR + (M8 + M10) dR/R^2$ | |
| 1 | 1 | 1 | 1 | 1 | V | $M6 dR/R + (M7 + M9) dR + (M8 + M10) dR/R^2$ | |

Note:
(1) The factors P1, P2, P3, and P4 above (refer to FIG. 5) represent current gains of the associated current mirrors to currents I1, I2.
(2) G2 assumed unity for simplicity (Vo = Vin in FIG. 2).

Figure 5:
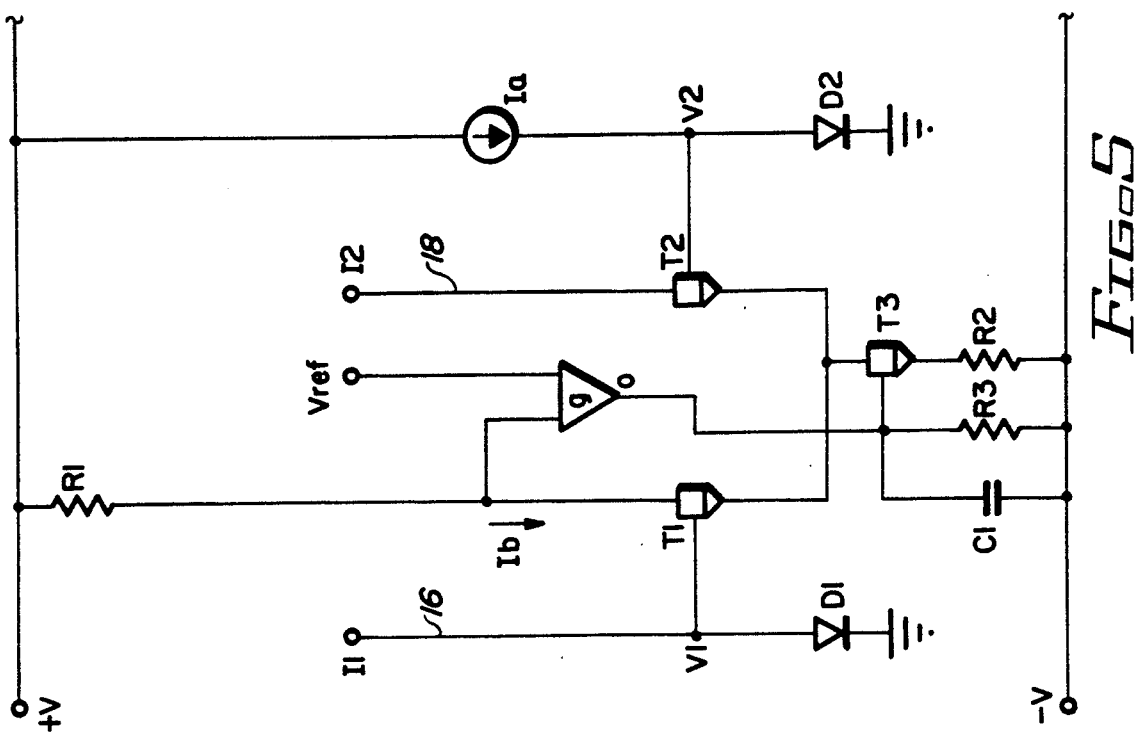
FIG. 5 is a circuit diagram of a specific embodiment for producing a signal inversely proportional to the resistance of the magnetoresistive element in FIG. 1.

In the event that a current I2, which is inversely proportional to the resistance $R_h$ of the MR element 10, is not already available from the preamplifier G1, a specific embodiment of a circuit for generating this inversely proportional current I2 is shown in FIG. 5. In this circuit, current I1 on line 16 is equal to current I1 on line 16 (FIG. 1), and this current is proportional to the resistance $R_h$ of the MR element.

The following relationship is therefore true:

$$\frac{I1}{I_a} = \frac{I_b}{I2} = e^{q/kT(V1-V2)}$$

$$I2 = \frac{K}{I1}$$

where K is a gain constant
and $g_0$ is a transconductance gain.

The inversely proportional current I2 is produced on line 18.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new and desire to secure by Letters Patent is:

1. A circuit for producing an electrical output signal whose magnitude is representative of signals produced by a magnetoresistive element, said circuit comprising:
  a magnetoresistive element having a steady-state resistance value;
  an input stage having input terminals and an output terminal;
  means for coupling said magnetoresistive element across the input terminals so that a signal representative of the signal produced by said magnetoresistive element is produced at said output terminal of said input stage;
  means within said input stage for generating a first control signal representative of the resistance of said magnetoresistive element;
  an output stage, coupled to the output terminals of said input stage, for amplifying and transmitting signals received therefrom, said output stage having a bias terminal and an output terminal;
  a feedforward circuit having a first input terminal and an output terminal, and means coupled between said input terminal and said output terminal of said feedforward circuit to generate a second control signal representing a chosen amplitude equalization characteristic of a signal coupled to the input terminal of said feedforward circuit;
  means for coupling said first control signal to said input terminal of said feedforward circuit; and
  means for coupling the output terminal of said feedforward circuit to said bias terminal of said output stage so that the signal at the output terminal of the output stage represents a chosen function of the signals produced by the magnetoresistive element.

2. The circuit of claim 1, wherein said chosen amplitude compensation characteristic comprises a linear combination of one or more of $R_h dR_h$, $dR_h$, $dR_h/R_h$, and $dR_h/R_h^2$, where $R_h$ is the resistance of the magnetoresistive element and $dR_h$ is the magnetic signal-induced magnetoresistance element resistance change.

3. The circuit of claim 1, wherein said input stage comprises a preamplifier which biases the magnetoresistive element with a constant voltage.

4. The circuit of claim 3, wherein said feedforward circuit comprises a current mirror circuit and a switching network.

5. The circuit of claim 4, wherein said first control signal is proportional to the resistance of said magnetoresistive element additionally comprising:
  means for generating a third control signal inversely proportional to the resistance of said magnetoresistive element;
  said feedforward circuit having a second input terminal; and
  means for coupling said third control signal to said second input terminal of said feedforward circuit 6. The circuit of claim 3, wherein said chosen amplitude compensation characteristic comprises a linear combination of one or more of $R_h dR_h$, $dR_h$, $dR_h/R_h$, and $dR_h/R_h^2$, where $R_h$ is the resistance of the magnetoresistive element and $dR_h$ is the magnetic signal-induced magnetoresistance element resistance change.

7. The circuit of claim 1, wherein said input stage comprises a preamplifier which biases the magnetoresistive element with a constant current.

8. The circuit of claim 7, wherein said feedforward circuit comprises a current mirror circuit and a switching network.

9. The circuit of claim 8, wherein said first control signal is proportional to the resistance of said magnetoresistive element additionally comprising:

means for generating a third control signal inversely proportional to the resistance of said magnetoresistive element;

said feedforward circuit having a second input terminal; and means for coupling said third control signal to said second input terminal of said feedforward circuit.

10. The circuit of claim 7, wherein said chosen amplitude compensation characteristic comprises a linear combination of one or more of $R_h dR_h$, $dR_h$, $dR_h/R_h$, and $dR_h/R_h^2$, where $R_h$ is the resistance of the magnetoresistive element and $dR_h$ is the magnetic signal-induced magnetoresistance element resistance change.

* * * * *